United States Patent [19]

Lezan et al.

[11] Patent Number: 4,775,925
[45] Date of Patent: Oct. 4, 1988

[54] METHOD AND APPARATUS FOR DETERMINING THE CONTROL ELECTRODE TO CATHODE JUNCTION VOLTAGE OF A CONTROL TURN-OFF SEMICONDUCTOR DEVICE AND USE OF SUCH DETERMINED VOLTAGE IN THE CONTROL OF THE DEVICE

[75] Inventors: Georges R. E. Lezan, Roanoke; Loren H. Walker, Salem, both of Va.

[73] Assignee: General Electric Company, Salem, Va.

[21] Appl. No.: 124,206

[22] Filed: Nov. 23, 1987

[51] Int. Cl.$^4$ .............................................. H02H 7/125
[52] U.S. Cl. ........................................ 363/54; 363/58; 363/78; 363/85; 363/96; 307/633
[58] Field of Search .................... 363/27–28, 363/54, 57–58, 68, 78–79, 85–88, 96, 128–130, 135–139; 307/252 C, 252 K, 252 L, 252 M; 361/86, 100

[56] References Cited

U.S. PATENT DOCUMENTS

| | | | |
|---|---|---|---|
| 4,600,917 | 7/1986 | Seki et al. | 363/54 |
| 4,641,231 | 2/1987 | Walker et al. | 363/58 |
| 4,674,023 | 6/1987 | Peppel et al. | 363/54 |
| 4,682,278 | 7/1987 | Marquardt et al. | 363/58 |

Primary Examiner—Peter S. Wong
Attorney, Agent, or Firm—Arnold F. Renner

[57] ABSTRACT

An apparatus and method relative to the operating of a control turn-off semiconductor device provide for determining the actual control electrode to cathode voltage upon the application of a turn-off control signal by adjusting the apparent value of that voltage by a value representing the voltage drop due to inductance in lead lines. The thusly adjusted value is employed to develop an output signal which indicates that the device has been turned off. In a further embodiment, the output signal may also be employed to reduce the value of the control signal from a first, relatively high value to a second, relatively low value.

23 Claims, 2 Drawing Sheets

METHOD AND APPARATUS FOR DETERMINING THE CONTROL ELECTRODE TO CATHODE JUNCTION VOLTAGE OF A CONTROL TURN-OFF SEMICONDUCTOR DEVICE AND USE OF SUCH DETERMINED VOLTAGE IN THE CONTROL OF THE DEVICE

BACKGROUND OF THE INVENTION

The present invention relates generally to the operation of control turn-off semiconductor devices and more particularly to a method and apparatus for determining, with respect to such a device, the control electrode to cathode junction voltage and the use of that determined voltage in the control of a signal utilized to render the device nonconductive.

Many power conversion and control systems presently in use employ semiconductor devices of the type generally referred to as control turn-off semiconductors. These semiconductor devices are of two general types, namely, power transistors and gate turn-off thyristors (GTOs). Although the GTO is more prevalent in today's applications, particularly in higher power applications, both device types have the common attributes of three electrodes which, although the commonly used terminology may vary, are basically an anode, a cathode and a control electrode, often referred to as a gate. These devices are rendered conductive (turned on) by a first type signal (normally positive) and rendered nonconductive (turned off) by a second type signal (usually negative). The magnitude of the signal required to turn a device off, however, and particularly in the case of the GTO, may be many times (e.g., 25 to 30) the magnitude of the signal required to turn the device on. For this reason, the greater problems are normally experienced with turning these devices off.

In many applications of the control turn-off semiconductor it is desirable to know the extant value of the control electrode to cathode junction voltage. A common purpose is to determine the conductive state of the semiconductor device for control purposes and for alarm or shutdown purposes, if the device is conducting at an improper time. An example of such a system is found in U.S. Pat. No. 4,641,231 "Apparatus and Method for Failure Testing of a Control Turn-Off Semiconductor" by Loren H. Walker and Georges R. Lezan, which patent is assigned to the assignee of the present invention and which patent is specifically incorporated hereinto by reference. That patent describes a typical power conversion scheme in which two semiconductors are connected in a series arrangement (commonly referred to as a leg) between the buses of a dc source. As illustrated in that patent, the commonly used three-phase converter has three legs each connected in mutual parallel between negative and positive dc buses. The semiconductors of the legs are rendered conductive in a predetermined order or sequence to control the ac electric power delivered from the bus to a load. If both semiconductors of any one leg become simultaneously conductive, it is apparent that a short circuit will exist between the two buses, which may result in damage to the load, the power source, and/or the semiconductors themselves.

The above cited patent employs the control electrode to cathode junction voltage in a scheme as just described. In that patent, a driver circuit (driver) is used to supply negative signals to the control electrode (gate of a GTO) to render the device nonconductive. It is assumed that the voltage at the output of the driver is the same as the control electrode to cathode junction voltage of the device itself. The value of this signal is directly compared to a fixed reference voltage to determine the conductive state of the device. That is, when the sensed voltage of this junction exceeds a value, that is an indication of a good device and a nonconducting or off condition. This indication, in the system described in that patent, allows the other semiconductor device or GTO of the leg to be turned on. In devices having relatively small current ratings, the direct sensing scheme as taught by the patent is entirely valid since the voltage drop due to lead inductance is relatively small with the smaller currents required to control the GTO. In fact, an inductance is often added to the driver circuit to limit the rate of current change (i.e., di/dt) and to protect the GTO. With higher rated devices, however, the magnitude of the current signal required to turn the device off (for example, 700 amperes) results in a voltage drop across the lead inductance (L di/dt) which may be so large as to obscure the true value of the control electrode to cathode voltage if the voltage at the output of the driver circuit is considered. While it is possible to employ a separate set of leads solely for purposes of voltage sensing, this is often not practical because of the particular physical configuration of the device and/or the structure of the heat sinks associated with the device.

A further problem with higher rated systems is that lead inductance severely limits the rate of change in the current (di/dt) for any given driver circuit voltage. While the use of a higher drive circuit voltage will provide sufficient di/dt for turn-off, if these higher voltages are allowed to remain across the control electrode to cathode junction once the semiconductor has been rendered nonconductive, the device may be destroyed because of excess reverse avalanche power.

SUMMARY OF THE INVENTION

It is, therefore, an object of the present invention to provide an improved method and apparatus for determining the control electrode to cathode junction voltage of a control turn-off semiconductor device.

It is a further object to provide a scheme to determine the control electrode to cathode junction voltage on a control turn-off device through measurement remote from the actual junction.

It is an additional object to determine the voltage of the control electrode to cathode junction of a control turn-off device through the adjustment of the apparent voltage by the voltage drop in the leads to the junction electrodes.

It is a still further object to determine the control electrode to cathode junction voltage of a control turn-off device and to employ that determination to control the power to the control electrode of the device to better assure turn-off while protecting the device from excess reverse avalanche power.

The foregoing and other objects are achieved, in accordance with the present invention, by the development of a first signal representing the voltage of the control signal to the control electrode at the output of a drive circuit which supplies that control signal. A second signal representing the voltage drop existing through the conductor or leads transmitting that control signal is also developed. The second signal is combined with the first, as by subtracting, to yield a third signal representative of the actual control electrode to cathode junction voltage. This third signal can be used in a scheme for protection and/or controlling the operation of other devices within the system. In accordance with a further embodiment of the present invention the third signal is used to control the magnitude of the power of the control signal furnished by a drive circuit in order to permit the initial use of a higher voltage to better insure turn-off while subsequently protecting the device from excess reverse avalanche power.

BRIEF DESCRIPTION OF THE DRAWING

While the present invention is defined in particularity in the claims annexed to and forming a part of this specification, a better understanding thereof can be had by reference to the following description taken in conjunction with the accompanying drawing in which:

DETAILED DESCRIPTION

Figure 1:
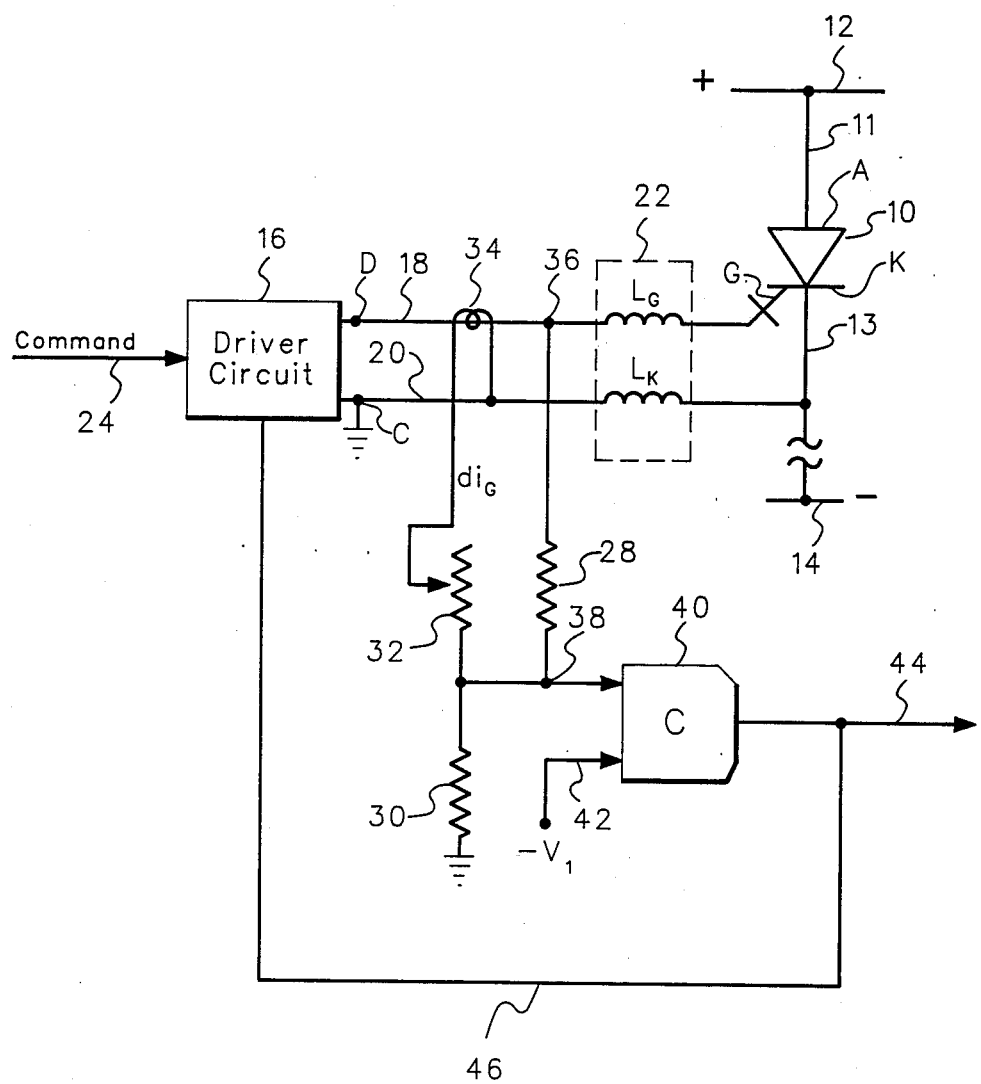
FIG. 1 is a schematic diagram illustrating the present invention in its preferred physical embodiment; and, FIG. 2 shows waveforms helpful in the understanding and the operation of the circuit depicted in FIG. 1 and the method of the present invention.

Reference is now made to FIG. 1 which illustrates the circuitry of the preferred embodiment of the present invention. A control turn-off semiconductor device 10, illustrated as a GTO, includes an anode A, a cathode K and a control electrode or gate G. The GTO 10 is connected between a positive bus 12 and a negative bus 14 by conductors 11 and 13. As is common and indicated by the break in line 13 between the cathode K and the bus 14, other devices and circuitry may exist in circuit with the GTO 10. Normally, in a polyphase power conversion system, one or more additional devices would be connected in series with the device 10. GTO 10 is connected to a driver circuit 16 by way of two conductors (leads) 18 and 20. Driver circuit 16, in response to input commands on an input line 24, as well as on line 46 as will be further described, serves to apply control (gating) signals to the control electrode to cathode junction to render the device 10 selectively in the conductive (on) and nonconductive (off) conditions. As is understood in the art, in a typical application, a positive signal of proper magnitude on line 18 to the gate electrode G will render the GTO conductive, while the application of an appropriate negative signal on that line will render the device nonconductive. (Customarily, a much larger magnitude signal is required to turn the device off than to turn it on; for example, a ratio in the range of about 25–30 to 1.) The exact nature of the driver circuit is not important to the present invention and it may take any suitable form common in the art. One well known type of driver circuit includes electronic switch devices such as field effect transistors (fets) which serve, in response to input commands, to connect supply buses to the conductors 18 and 20. Typically, consistent with the previous discussion, the positive bus voltage is smaller than the negative bus voltage. Most importantly, however, the driver circuit must provide the current requirements of the relative negative and positive gate signals of the ratio earlier described. As will be further understood as this description proceeds, the driver circuit 16 utilized in accordance with the present invention may include two different voltage levels (buses) for turn-off operation.

Included within a dashed line block 22, respectively in lines 18 and 20, are two inductances $L_G$ and $L_K$. These inductances do not actually exist as discrete entities as shown but are distributed along the length of lead lines connecting the driver circuit 16 to the respective electrodes of the device 10. Points D and C at the output of driver circuit 16 are designated as reference points for various signals to be described. Point D on line 18 is the reference point for driver circuit output voltages to the logic ground point C on line 20.

A current transformer 34 has one end connected to conductor 20 and is positioned around line 18 to be responsive to currents therein. Current transformer 34 is preferably of the "miniature" type having a high exciting current so that it may be thought of as generating a secondary voltage which is a measure of the rate of change of current in line 18 (i.e., di/dt). Current transformer 34 may be, for example, of the air core or ferrite core types with the air core type being preferred since a ferrite core transformer might, in certain circumstances, exhibit saturation characteristics which would require additional circuitry for reset purposes. The other end of current transformer 34 is connected by way of a variable resistor 32 to circuit node 38. The output of the current transformer 34 is a voltage proportional to the rate of change ($di_G$) of the gate current in lead 18.

A second connection to node 38, by way of resistor 28 connected to node 36 on gate lead 18, provides a signal to node 38 representing the driver output voltage. Node 38 is further connected to logic ground by way of a resistor 30.

The resistor network formed by resistors 28, 30 and 32 is the summing network which combines the driver circuit output voltage to the signal proportional to the rate of change of gate current ($di_G$) to thus reconstruct, at node 38, a voltage proportional to the instantaneous voltage at the gate to cathode voltage of the GTO 10. By properly adjusting the value of resistor 32 with respect to the value of resistor 28, the gain of the network 32, 28, 30 can be made such that the voltage at node 38 will have the same waveform as the gate to cathode junction voltage of GTO 10. One way of accomplishing the adjustment of resistor 32 is to observe by way of, for example, an oscilloscope, the voltage at node 38. The value of resistor 32 will be essentially a constant for a given configuration of drive circuit and lead lines and once set does not require frequent adjustment. It is noted that the setting of resistor 32 is not highly critical.

The signal at node 38, the representation of the voltage at the gate to cathode junction is applied as one input to a comparator 40. The other input of comparator 40, applied via line 42, is a fixed voltage from a reference source $-V_1$. The value of voltage $-V_1$ is normally about one-half the reverse avalanche voltage of the GTO 10. When the gate to cathode voltage represented at node 38 becomes less than $-V_1$, comparator 40 provides an output signal on line 44 indicating that the GTO 10 has been rendered nonconductive. This signal may be used, for example, to indicate that it is now safe to fire other devices which are in series with device 10 without creating, as illustrated in FIG. 1, a short between buses 12 and 14. The output at line 44 corresponds directly to the output of the comparators (30, 32) shown in the aforementioned U.S. Pat. No. 4,641,231 and this output on line 44 may be used for the purposes defined in that patent.

The output of comparator 40 is also applied, via line 46, to the driver circuit 16. This signal, in accordance with the second feature of the present invention, is used to reduce the output of the driver circuit 16 from an initial value which was adequate to provide sufficient di/dt to render the GTO nonconductive (but which if retained might damage that device) to a value which is safe for steady state application to device 10. This feature, as earlier indicated, requires a dual negative output capability from drive current 16 and is more fully understood from FIG. 2.

Figure 2:
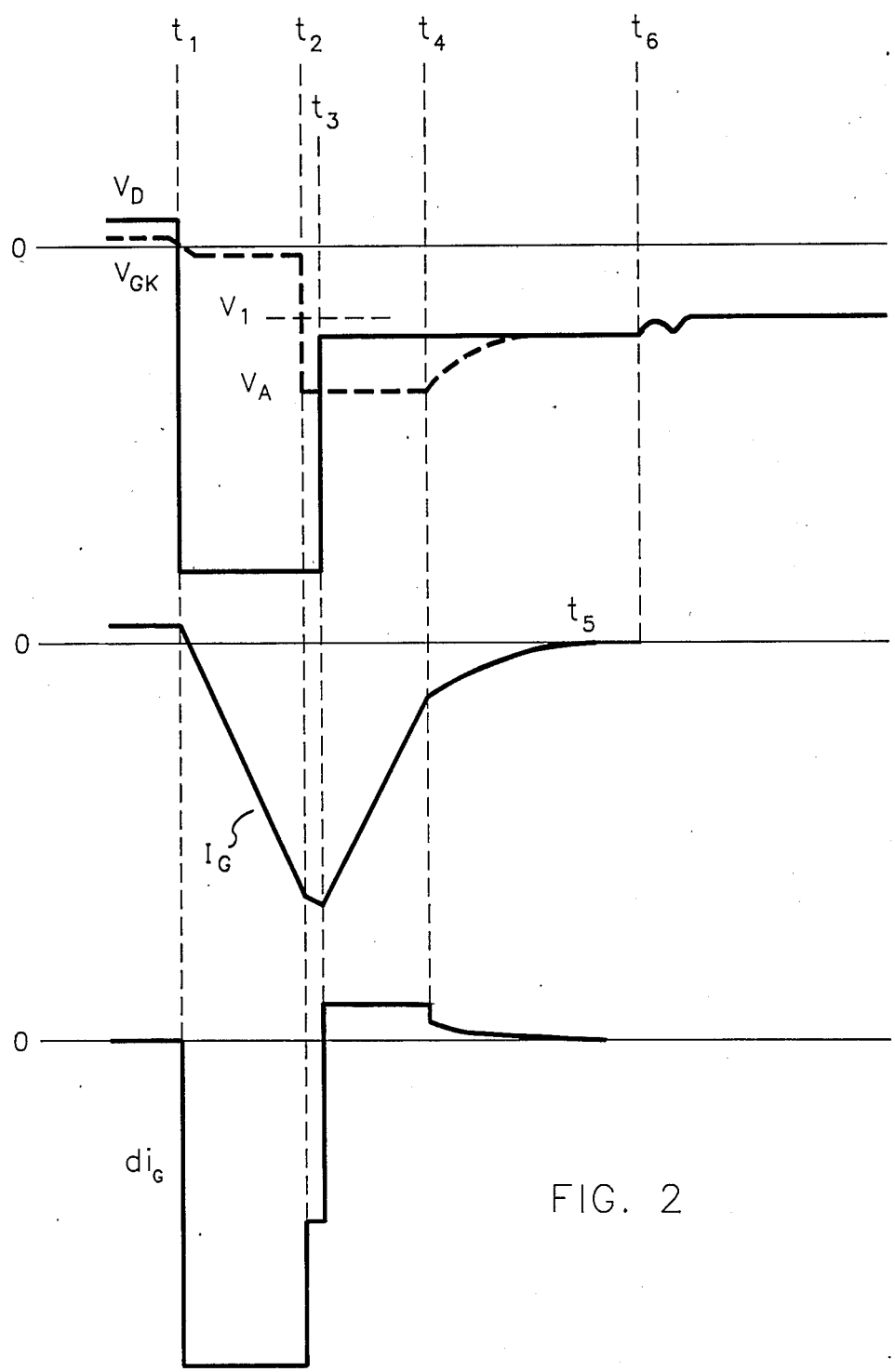

The waveforms of FIG. 2 illustrate the operation of the circuitry of FIG. 1 and the method of the present invention. As shown in FIG. 2, in the upper trace, waveshape $V_D$ is the output of the driver circuit as seen at point D on line 18. Waveform $V_{GK}$, shown in heavy dashed line, illustrates the actual voltage across the gate to cathode junction of GTO 10. The difference between these two voltages would be the voltage that is dropped across the distributed lead inductances $L_G$ and $L_K$. Prior to time $t_1$, the $V_D$ signal is positive indicating a conducting state of the GTO. At time $t_1$, the driver circuit initiates a turn-off signal and thus applies a large negative voltage to the control electrode (gate) of device 10. This large negative voltage causes a rapid rate of change (negative) in gate current ($I_G$) as shown in the center trace of FIG. 2. At time $t_2$ the gate to cathode voltage ($V_{GK}$) decreases suddenly to level $V_A$, the negative avalanche voltage of the gate to cathode junction. This $V_A$ voltage is seen as the signal which appears in node 38 (FIG. 1) and is applied to comparator 40 which detects this rise in voltage and sends a signal, via line 46, to the gate driver circuit 16 commanding that gate driver to reduce the reverse drive voltage on conductor 18 to some lesser value; for example, a value slightly lower than gate avalanche voltage $V_A$. At time $t_3$, driver circuit 16 responds to the command on line 46 and drops the voltage $V_D$ to that value. The time between times $t_2$ and $t_3$ should be minimized in the design of the driver circuit. That is, that response time of the circuit 16 should be as fast as practical.

The center trace in FIG. 2 shows the waveform of the gate current $I_G$. It is seen that it rises rapidly in the reverse direction between times $t_1$ and $t_2$ under the influence of the large negative $V_D$ voltage. At time $t_2$ the back emf introduced by the avalanche voltage of the GTO reduces the rate of change in $I_G$ (period $t_2$ to $t_3$). At time $t_3$ the drive voltage $V_D$ becomes smaller than the reverse avalanche voltage and the sense of the rate of change of $I_G$ reverses. At time $t_4$ the reverse gate current matches the so-called "tail current" of the GTO, and the GTO controls its own gate current during the period $t_4$ and $t_5$. (Tail current is the anode to gate current after the anode to cathode current of the GTO has been reduced to zero). At time $t_6$ the reduced $V_D$ voltage may be removed since the tail current has gone to zero. However, whether or not this hard voltage is removed is basically immaterial since, if this voltage as shown after time $t_3$ is less than the avalanche voltage of the device, no harm will be done by leaving this voltage on. If the voltage is removed, however, time $t_6$ becomes the minimum off signal time for the driver circuit 16. After time $t_6$ there is no need to change the output of the driver circuit unless the main controls call for the GTO to turn on again.

The bottom trace on FIG. 2 is the rate of current change signal $di_G$ as it appears across the current transformer 34. In accordance with the previous discussion, this signal represents the voltage drop across the lead inductances ($L_G$ and $L_K$). The $V_{GK}$ signal is derived by subtracting the $di_G$ signal of the lower trace from the $V_D$ signal of the upper trace. This subtraction is accomplished by the resistor summing network, resistors 28, 30 and 32 in FIG. 1.

As a safety feature, so as to prevent damage to the semiconductor device 10, the driver circuit 16 might include a timing feature which would limit the time the large negative voltage ($V_D$), shown between times $t_1$ and $t_2$, is applied to device 10.

While there have been known and described what are presently considered to be the of the preferred embodiments of the present invention, modifications thereto will readily occur to those skilled in the art. It is not desired, therefore, that the present invention be limited to the specific arrangements shown and described and it is intended to cover, in the appended claims, all such modifications as fall within the true spirit and scope of the invention.

What is claimed is:

1. A method for determining, with respect to a control turn-off semiconductor device having an anode, a cathode and a control electrode, the extant voltage between said control electrode and said cathode resulting from the application of control signals, from a driver circuit, to vary the conductive state of said semiconductor device, comprising the steps:
    (a) generating a first signal representing the voltage of said control signal at an output of said driver circuit;
    (b) generating a second signal representing the voltage drop existing on conductors transmitting said control signal from said driver circuit to said control electrode and cathode; and,
    (c) combining said first and second signals to produce a third signal representing said extant voltage between said control electrode and said cathode.

2. The method in accordance with claim 1 wherein said second signal is generated in response to a current value of said control signal.

3. The method in accordance with claim 2 wherein said voltage drop is occasioned by inductance of said conductors and said current value is a rate of change with respect to time.

4. The method in accordance with claim 1 wherein said first, second and third signals are established with respect to a logic system ground.

5. The method in accordance with claim 1 wherein said step of combining involves the subtracting a value of said second signal from a value of said first signal.

6. A method for detecting the conductive state of a control turn-off semiconductor device having an anode and a cathode and a control electrode to which control signals are supplied from a driver circuit to control the conductive state of said semiconductor device, comprising the steps:
    (a) generating a first signal representing the voltage of said control signal at an output of said driver circuit;
    (b) generating a second signal representing the voltage drop existing on conductors transmitting said control signal from said driver circuit to said control electrode and cathode;
    (c) combining said first and second signals to produce a third signal representing the extant voltage between said control electrode and said cathode; and,
    (d) comparing said third signal with a reference signal of predetermined value to develop an output signal representative of a nonconductive state of said semiconductor device.

7. The method in accordance with claim 6 wherein said second signal is generated in response to a current value of said control signal.

8. The method in accordance with claim 7 wherein said voltage drop is occasioned by inductance of said conductors and said current value is a rate of change with respect to time.

9. The method in accordance with claim 6 wherein the predetermined value of said reference signal is approximately one-half of the value of the reverse avalanche voltage of said semiconductor device.

10. An improved method for controlling the operation of a control turn-off semiconductor device having an anode, a cathode and a control electrode with respective junctions therebetween comprising:
(a) selectively providing control signals of a first magnitude by way of conductor leads to the control electrode to cathode junction to render said semiconductor nonconductive;
(b) generating a first voltage signal proportional to the voltage of said control signal;
(c) generating a second voltage signal proportional to the voltage drop existing on said conductor leads;
(d) combining said first and second voltage signals to provide a third signal proportional to the actual control electrode to the cathode junction voltage;
(e) comparing said third signal with a reference signal of predetermined magnitude to develop an output signal representative of a nonconductive state of said semiconductor device; and
(f) reducing the value of said control signal to a second magnitude in response to said output signal.

11. The method in accordance with claim 10 wherein said second signal is generated in response to a current value of said control signal.

12. The method in accordance with claim 11 wherein said voltage drop is occasioned by inductance of said conductors and said current value is a rate of change with respect to time.

13. The method in accordance with claim 10 wherein the predetermined magnitude of said reference signal is approximately one-half the value of the reverse avalanche voltage of the control electrode to cathode junction.

14. The method in accordance with claim 10 wherein the first magnitude of said control signal is in excess of and the second magnitude of said control signal is less than the reverse avalanche voltage of said control electrode to cathode junction.

15. The method in accordance with claim 13 wherein the first magnitude of said control signal is in excess of and the second magnitude of said control signal is less than the reverse avalanche voltage of said control electrode to cathode junction and wherein the second magnitude of said control signal is greater in value than the predetermined magnitude of said reference signal.

16. An improved scheme for controlling the operation of a control turn-off semiconductor device having an anode, a cathode and a control electrode, with respective junctions therebetween, comprising:
(a) a driver circuit for selectively providing turn-off control signals by way of conductor leads to the control electrode to cathode junction render said semiconductor device nonconductive;
(b) means to develop a first voltage signal proportional to the voltage of the turn-off control signal from said driver circuit;
(c) means to develop a second voltage signal proportional to the voltage drop existing on said conductor leads; and,
(d) means to combine said first and second voltage signals to provide a third signal proportional to the actual control electrode to cathode junction voltage.

17. The invention in accordance with claim 16 wherein said means to develop said second voltage signal includes a current transformer for sensing a current value in the lead to the control electrode.

18. The invention in accordance with claim 17 wherein said current transformer is an air core transformer.

19. The invention in accordance with claim 16 wherein said voltage drop is occasioned by inductance in said leads.

20. The invention in accordance with claim 16 further including means to compare said third signal with a reference signal having a predetermined value and to provide an output signal when said third signal exceeds said reference signal in magnitude, said output signal representative of a nonconductive state of said semiconductor device.

21. The invention in accordance with claim 20 wherein said driver circuit selectively provides turn-off control signals of a first magnitude and of a second magnitude of a lesser value than said first magnitude and further including means to furnish said output signal to said driver circuit to cause said driver circuit to switch its control signal from the first to the second magnitude.

22. The invention in accordance with claim 21 wherein the first magnitude of said control signal is greater than the reverse avalanche voltage of the control electrode to cathode voltage and the second magnitude of said control signal is less than said reverse avalanche voltage.

23. The invention in accordance with claim 17 wherein said means to combine includes a resistor network including a variable resistor in circuit with said current transformer whereby said second voltage signal may be adjusted by varying the resistance value of said resistor.

* * * * *